(12) United States Patent
Hsu et al.

(10) Patent No.: US 11,855,004 B2
(45) Date of Patent: Dec. 26, 2023

(54) PACKAGE STRUCTURE

(71) Applicant: Taiwan Semiconductor Manufacturing Company, Ltd., Hsinchu (TW)

(72) Inventors: Chia-Kuei Hsu, Hsinchu (TW); Ming-Chih Yew, Hsinchu (TW); Shu-Shen Yeh, Taoyuan (TW); Che-Chia Yang, Taipei (TW); Po-Yao Lin, Zhudong Township Hsinchu County (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 177 days.

(21) Appl. No.: 17/350,351

(22) Filed: Jun. 17, 2021

(65) Prior Publication Data

US 2022/0406731 A1 Dec. 22, 2022

(51) Int. Cl.
 *H01L 23/31* (2006.01)
 *H01L 23/538* (2006.01)
 *H01L 23/00* (2006.01)
 *H01L 25/065* (2023.01)
 *H01L 21/683* (2006.01)
 (Continued)

(52) U.S. Cl.
 CPC ........ *H01L 23/562* (2013.01); *H01L 21/4853* (2013.01); *H01L 21/4857* (2013.01); *H01L 21/563* (2013.01); *H01L 21/565* (2013.01); *H01L 21/568* (2013.01); *H01L 21/6835* (2013.01); *H01L 23/3128* (2013.01); *H01L 23/3135* (2013.01); *H01L 23/5383* (2013.01); *H01L 23/5386* (2013.01); *H01L 24/16* (2013.01); *H01L 25/0655* (2013.01); *H01L 2221/68372* (2013.01); *H01L 2224/16227* (2013.01); *H01L 2924/18161* (2013.01); *H01L 2924/3512* (2013.01)

(58) Field of Classification Search
 CPC ........................... H01L 23/5386; H01L 24/16
 See application file for complete search history.

(56) References Cited

U.S. PATENT DOCUMENTS 9,000,584 B2 4/2015 Lin et al.
9,048,222 B2 6/2015 Hung et al.
(Continued)

FOREIGN PATENT DOCUMENTS

TW 201916299 A 4/2019

OTHER PUBLICATIONS

Chinese language office action dated Nov. 14, 2022, issued in application No. TW 111113025.

*Primary Examiner* — Selim U Ahmed
*Assistant Examiner* — Evan G Clinton
(74) *Attorney, Agent, or Firm* — McClure, Qualey & Rodack, LLP

(57) ABSTRACT

A package structure is provided. The package structure includes a first conductive pad in an insulating layer, a first under bump metallurgy structure under the first insulating layer, and a first conductive via in the insulating layer. The first conductive via is vertically connected to the first conductive pad and the first under bump metallurgy structure. In a plan view, a first area of the first under bump metallurgy structure is confined within a second area of the first conductive pad.

20 Claims, 17 Drawing Sheets

(51) Int. Cl.
*H01L 21/48* (2006.01)
*H01L 21/56* (2006.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 11,024,979 B2 | 6/2021 | Liao et al. |
| 2013/0299967 A1* | 11/2013 | Daniels ............ H01L 24/05 |
| | | 438/689 |
| 2014/0374921 A1* | 12/2014 | Yu .................. H01L 23/13 |
| | | 257/777 |
| 2017/0188458 A1 | 6/2017 | Hsieh et al. |
| 2018/0033650 A1 | 2/2018 | Chen |
| 2019/0273001 A1 | 9/2019 | Yu et al. |
| 2020/0135674 A1 | 4/2020 | Chen et al. |
| 2022/0052006 A1* | 2/2022 | Kang ................ H01L 24/05 |
| 2022/0102256 A1* | 3/2022 | Kwon ........... H01L 23/49833 |

* cited by examiner

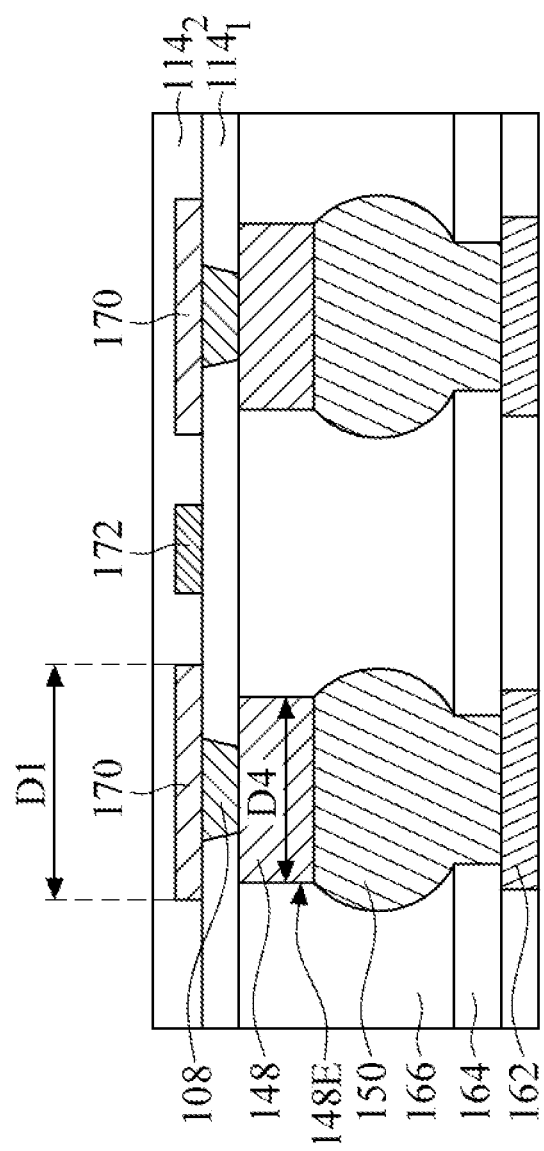
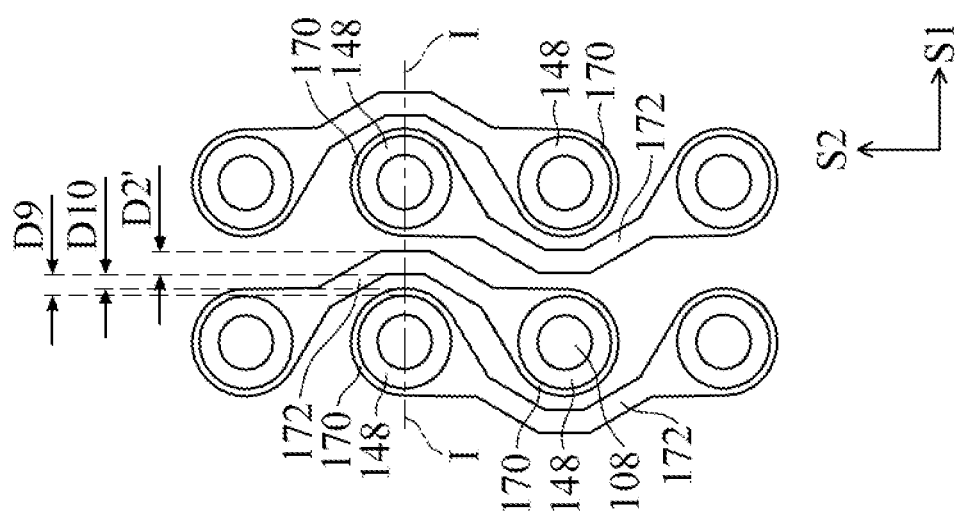
FIG. 4-2
FIG. 4-1

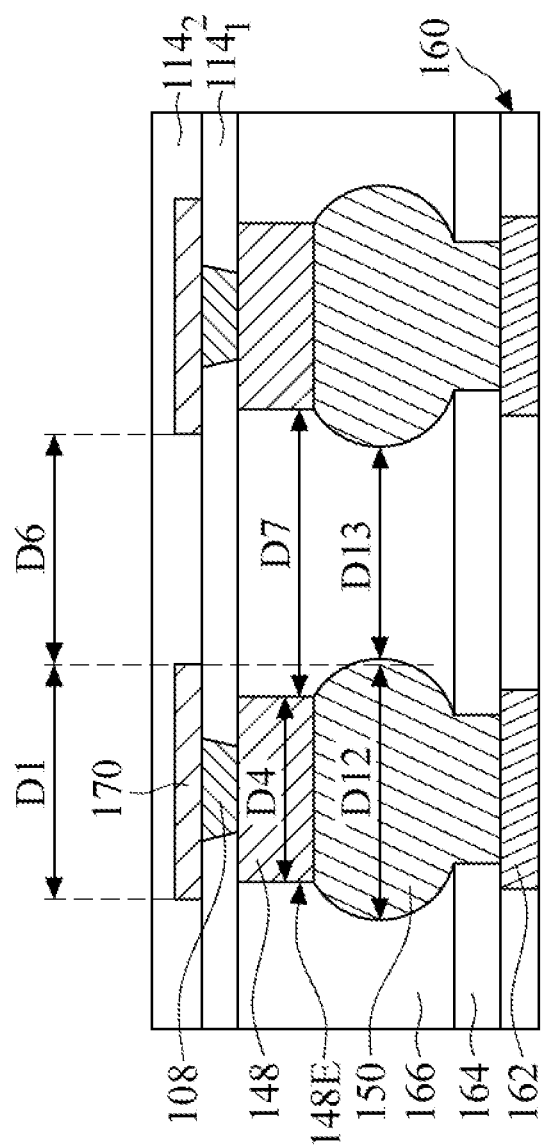
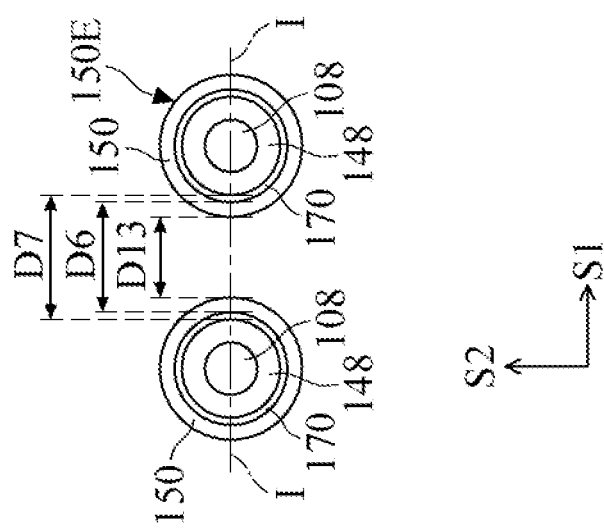
FIG. 6-2
FIG. 6-1

PACKAGE STRUCTURE

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased. This scaling-down process generally provides benefits by increasing production efficiency and lowering associated costs.

A chip package not only provides protection for semiconductor devices from environmental contaminants, but also provides a connection interface for the semiconductor devices packaged therein. Smaller package structures, which utilize a smaller area or are lower in height, have been developed to package the semiconductor devices.

New packaging technologies have been developed to further improve the density and functionalities of semiconductor dies. These relatively new types of packaging technologies for semiconductor dies face manufacturing challenges.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1G-1 is a perspective view illustrating an under bump metallurgy structure and components adjacent thereto, in accordance with some embodiments of the disclosure.

FIG. 1G-2 is a plan view illustrating the under bump metallurgy structure and components adjacent thereto, in accordance with some embodiments of the disclosure.

FIG. 1G-3 is a cross-sectional view illustrating under bump metallurgy structure and components adjacent thereto, in accordance with some embodiments of the disclosure.

FIG. 2-1 is a plan view illustrating under bump metallurgy structures and components adjacent thereto, in accordance with some embodiments of the disclosure.

FIG. 2-2 is a cross-sectional view illustrating the under bump metallurgy structures and components adjacent thereto, in accordance with some embodiments of the disclosure.

FIG. 3-1 is a plan view illustrating under bump metallurgy structures and components adjacent thereto, in accordance with some embodiments of the disclosure.

FIG. 3-2 is a cross-sectional view illustrating under bump metallurgy structures and components adjacent thereto, in accordance with some embodiments of the disclosure.

FIG. 4-1 is a plan view illustrating under bump metallurgy structures and components adjacent thereto, in accordance with some embodiments of the disclosure.

FIG. 4-2 is a cross-sectional view illustrating under bump metallurgy structures and components adjacent thereto, in accordance with some embodiments of the disclosure.

FIG. 5-1 is a plan view illustrating under bump metallurgy structures and components adjacent thereto, in accordance with some embodiments of the disclosure.

FIG. 5-2 is a cross-sectional view illustrating under bump metallurgy structures and components adjacent thereto, in accordance with some embodiments of the disclosure.

FIG. 6-1 is a plan view illustrating under bump metallurgy structures and components adjacent thereto, in accordance with some embodiments of the disclosure.

FIG. 6-2 is a cross-sectional view illustrating under bump metallurgy structures and components adjacent thereto, in accordance with some embodiments of the disclosure.

FIG. 7-1 is a plan view illustrating under bump metallurgy structures and components adjacent thereto, in accordance with some embodiments of the disclosure.

FIG. 7-2 is a cross-sectional view illustrating under bump metallurgy structures and components adjacent thereto, in accordance with some embodiments of the disclosure.

DETAILED DESCRIPTION

Figure 1A:
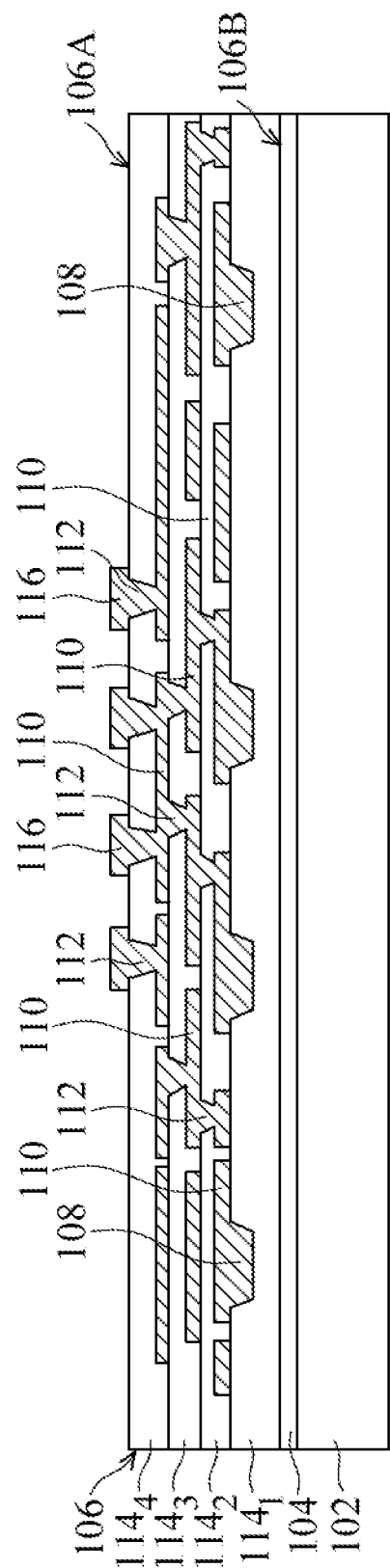
FIGS. 1A through 1H are cross-sectional views illustrating the formation of a package structure at various intermediate stages, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments of a package structure are provided. The package structure may include a conductive pad, an under bump metallurgy structure, and a conductive via connecting the conductive pad and the under bump metallurgy structure. The conductive pad entirely covers the corner of the under bump metallurgy structure contacting an insulating layer, thereby reducing or mitigating a tensile stress concentrated at the corner of the under bump metallurgy structure. As a result, the risk of cracking the insulating layer may be reduced, improving the performance and reliability of the package structure.

FIGS. 1A through 1H are cross-sectional views illustrating the formation of a package structure at various intermediate stages, in accordance with some embodiments of the disclosure.

A carrier substrate 102 is received or provided, as shown in FIG. 1A, in accordance with some embodiments. In some embodiments, the carrier substrate 102 is a ceramic substrate, a glass substrate, a polymer substrate, a semiconductor substrate, or another suitable substrate.

An adhesive tape 104 is disposed over the carrier substrate 102, as shown in FIG. 1A, in accordance with some embodiments. In some embodiments, the adhesive tape 104 is sensitive to an energy beam irradiation. In some embodiments, the adhesive tape 104 is a release layer that is made of or includes a light-to-heat conversion (LTHC) material. For example, a laser beam may be used to irradiate the adhesive tape 104 in a subsequent process. The irradiation may allow a package structure formed over the adhesive tape 104 to be separated from the carrier substrate 102.

A redistribution structure 106 is formed over the adhesive tape 104, as shown in FIG. 1A, in accordance with some embodiments. The redistribution structure 106 is configured for routing, which enables the formation of a package structure with fan-out features. The redistribution structure 106 may also be referred to as an interposer. The redistribution structure 106 has a bottom surface 106B facing the carrier substrate 102 and a top surface 106A facing away from the carrier substrate 102, in accordance with some embodiments.

In some embodiments, the redistribution structure 106 includes multiple insulating layers such as insulating layers $114_1$, $114_2$, $114_3$ and $114_4$ and multiple conductive features such as conductive vias 108, conductive lines 110 and conductive vias 112 formed in the insulating layers $114_1$-$114_4$. Although FIG. 1A shows four insulating layers $114_1$-$114_4$, the number of insulating layers is not limited thereto and the redistribution structure 106 may include more or fewer insulating layers, for example, it may have between 2 and 10 layers.

In some embodiments, the conductive vias 108 are surrounded by and/or embedded in the bottom insulating layer $114_1$. In some embodiments, the conductive vias 108 are configured to provide vertical electrical routing. In some embodiments, the conductive vias 108 are to be exposed from or protrude from the bottom surface 106B of the redistribution structure 106 and used to hold or receive under bump metallurgy (UBM) structures and bonding elements.

In some embodiments, the conductive lines 110 are surrounded by and/or embedded in the insulating layers $114_2$-$114_4$. In some embodiments, the conductive lines 110 include conductive pads and conductive traces and are configured to provide horizontal electrical routing. In some embodiments, the conductive vias 108 are in contact with the conductive pads of the conductive lines 110 in the insulating layer $114_2$.

In some embodiments, the conductive vias 112 are surrounded by and/or embedded in the insulating layers $114_2$-$114_4$. In some embodiments, the conductive vias 112 are configured to provide vertical electrical routing. In some embodiments, the conductive vias 112 land on the conductive pads of the conductive lines 110, thereby electrically coupling the conductive lines 110 in different insulating layers 114. In some embodiments, the conductive vias 112 in the insulating layer $114_4$ are exposed from and/or protruding from the top surface 106A of the insulating layer $114_4$ and are used to hold or receive under bump metallurgy structures and bonding elements.

In some embodiments, the insulating layers 114 may be made of one or more polymer materials. The polymer material(s) may include polybenzoxazole (PBO), benzocyclobutene (BCB), polyimide (PI), epoxy-based resin, one or more other suitable polymer materials, or a combination thereof. In some embodiments, the polymer material is photosensitive. A photolithography process may therefore be used to form openings with desired patterns in the insulating layers $114_1$-$114_4$. In alternative embodiments, the insulating layers 114 are made of one or more dielectric materials such as silicon oxide, silicon nitride and/or silicon oxynitride.

In some embodiments, the conductive vias 108, the conductive lines 110 and conductive vias 112 are made of metallic material such as copper, aluminum, gold, palladium, cobalt, titanium, nickel, silver, graphene, one or more other suitable conductive materials, an alloy thereof, or a combination thereof. In some embodiments, the conductive vias 108, the conductive lines 110 and conductive vias 112 are made of non-solder metallic material. In some embodiments, the conductive vias 108, the conductive lines 110 and conductive vias 112 include multiple sub-layers. For example, each of the conductive vias 108, the conductive lines 110 and conductive vias 112 contains multiple sub-layers including Ti/Cu, Ti/Ni/Cu, Ti/Cu/Ti, Al/Ti/Ni/Ag, other suitable sub-layers, or a combination thereof.

The formation of the redistribution structure 106 may involve multiple deposition processes, multiple patterning processes, and/or multiple planarization processes. The deposition processes may be used to form insulating layers and/or conductive features. The deposition processes may include a spin coating process, an electroplating process, an electroless process, a chemical vapor deposition (CVD) process, a physical vapor deposition (PVD) process, an atomic layer deposition (ALD) process, one or more other applicable processes, or a combination thereof.

The patterning processes may be used to pattern the formed insulating layers and/or the formed conductive layers. The patterning processes may include a photolithography process, an energy beam drilling process (such as a laser beam drilling process, an ion beam drilling process, or an electron beam drilling process), an etching process, a mechanical drilling process, one or more other applicable processes, or a combination thereof.

The planarization processes may be used to provide the formed insulating layers and/or the formed conductive layers with planar top surfaces to facilitate subsequent processes. The planarization processes may include a mechanical grinding process, a chemical mechanical polishing (CMP) process, a dry polishing process, one or more other applicable processes, or a combination thereof.

Under bump metallurgy structures 116 are formed over the top surface 106A of the redistribution structure 106, in accordance with some embodiments. In some embodiments, the under bump metallurgy structures 116 correspond and in contact with the conductive vias 112 exposed from the insulating layer 114$_4$.

In some embodiments, the under bump metallurgy structures 116 are used to hold or receive bonding elements such as solder balls. UBM material may be used to increase adherence of solder (such as by providing solderability and wettability for solder), provide a solder diffusion barrier, provide some stress relief in the connection between the solder and the conductive vias 112, and provide low resistance in the contact to the conductive vias 112.

In some embodiments, the under bump metallurgy structures 116 are made of or include metallic material such as titanium, copper, nickel, tantalum, vanadium, chromium, gold, tungsten, an alloy thereof, a multi-layer thereof, or a combination thereof. In some embodiments, the under bump metallurgy structures 116 are made of non-solder metallic material. In some embodiments, the under bump metallurgy structures 116 are formed using sputtering, evaporation, plating, another suitable technique, and/or a combination thereof.

Figure 1B:
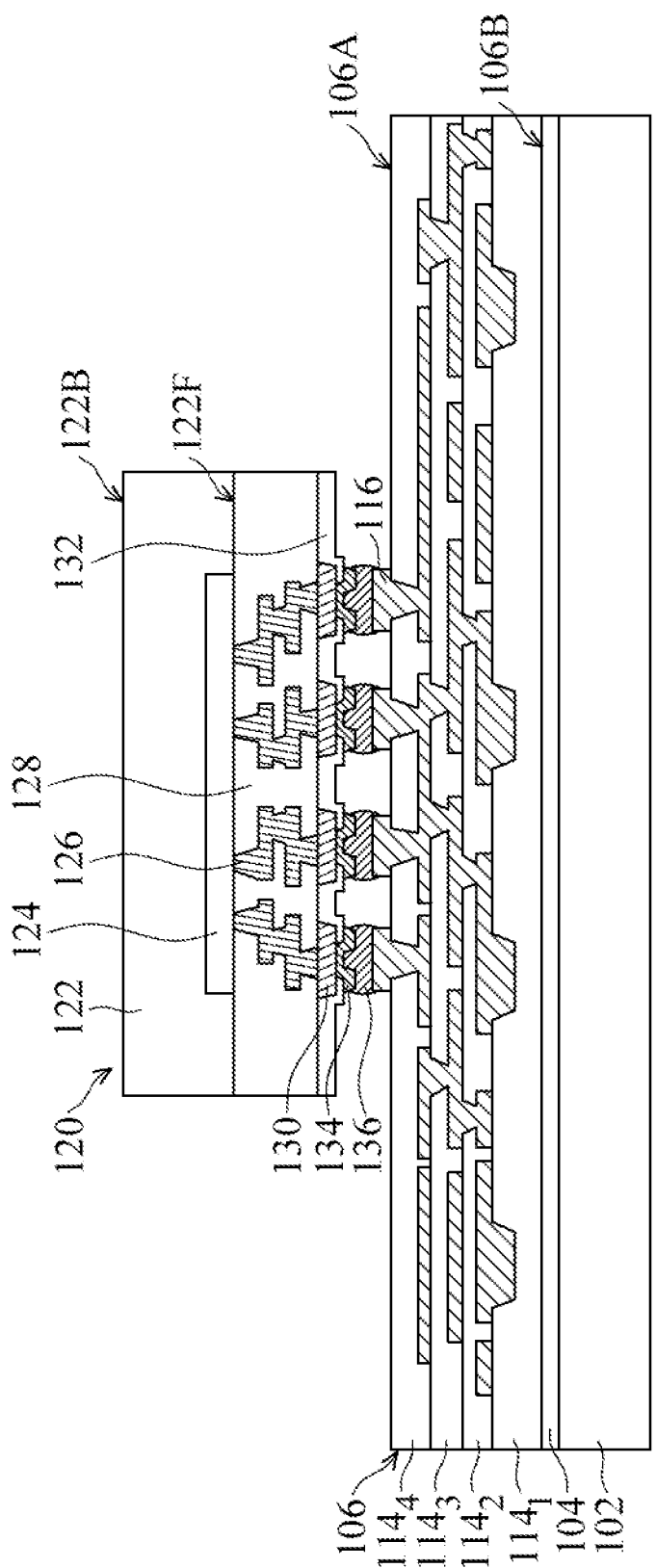

A semiconductor die 120 is disposed over and bonded to the top surface 106A of the redistribution structure 106, as shown in FIG. 1B, in accordance with some embodiments. The semiconductor die 120 may include application processors, power management integrated circuits, logic devices, memory devices (e.g., static random access memories, SRAMs), radio frequency (RF) devices, input/output (I/O) devices, system-on-chip (SoC) devices, application-specific integrated circuit (ASIC), one or more other suitable circuits, or a combination thereof.

In some embodiments, the semiconductor die 120 includes a semiconductor substrate 122 having a backside surface 122B and a front surface 122F. In some embodiments, the semiconductor die 120 also includes an integrated circuit 124 formed in and/or on the front surface 122F of the semiconductor substrate 122. In some embodiments, the semiconductor die 120 also includes an interconnect structure 126 surrounded by an intermetal (IMD) dielectric layer 128 and electrically coupled to the integrated circuit 124. In some embodiments, the semiconductor die 120 also includes conductive pads 130 formed over and electrically coupled to the interconnect structure 126. In some embodiments, the semiconductor die 120 also includes a passivation layer 132 partially covering the conductive pads 130 and having openings partially exposing the conductive pads 130.

Under bump metallurgy structures 134 are formed over the conductive pads 130 of the semiconductor die 120, in accordance with some embodiments. The under bump metallurgy structures 134 pass through the passivation layer 132 and cover the exposed surface of the conductive pads 130.

In some embodiments, the under bump metallurgy structures 134 are used to hold or receive bonding elements 136. UBM material may be used to increase adherence of solder (such as by providing solderability and wettability for solder), provide a solder diffusion barrier, provide some stress relief in the connection between the solder and the conductive pads 130, and provide low resistance in the contact to the conductive pads 130.

In some embodiments, the under bump metallurgy structures 134 are made of or include metallic material such as titanium, copper, nickel, tantalum, vanadium, chromium, gold, tungsten, an alloy thereof, a multi-layer thereof, or a combination thereof. In some embodiments, the under bump metallurgy structures 134 are made of non-solder metallic material. In some embodiments, the under bump metallurgy structures 134 are formed using sputtering, evaporation, plating, another suitable technique, and/or a combination thereof.

In some embodiments, an electroplating process is performed to form the bonding elements 136 over the under bump metallurgy structures 134. In alternative embodiments, the bonding elements 136 are pre-formed and placed over the under bump metallurgy structures 116.

In some embodiments, the bonding elements 136 are solder joints, microbumps, solder bumps, solder balls, ball grid array (BGA) balls, controlled collapse chip connection (C4) bumps, another suitable bonding elements, and/or a combination thereof. In some embodiments, the bonding elements 136 are tin-containing solder balls bumps or solder balls. The tin-containing solder bumps or balls may include copper, silver, gold, aluminum, lead, one or more other suitable materials, or a combination thereof. In some embodiments, the bonding elements 136 are lead-free.

The conductive pads 130 of the semiconductor die 120 are bonded to conductive vias 112 of the redistribution structure 106 through the under bump metallurgy structures 134, the bonding elements 136 and the under bump metallurgy structures 116, in accordance with some embodiments. In some embodiments, a thermal reflow operation is carried out. In some embodiments, the bonding elements 136 correspond to and connect the under bump metallurgy structures 134 and the under bump metallurgy structures 116. As such, the integrated circuit 124 is electrically coupled to the conductive features 108, 110 and 112 of the redistribution structure 106, in accordance with some embodiments.

Figure 1C:
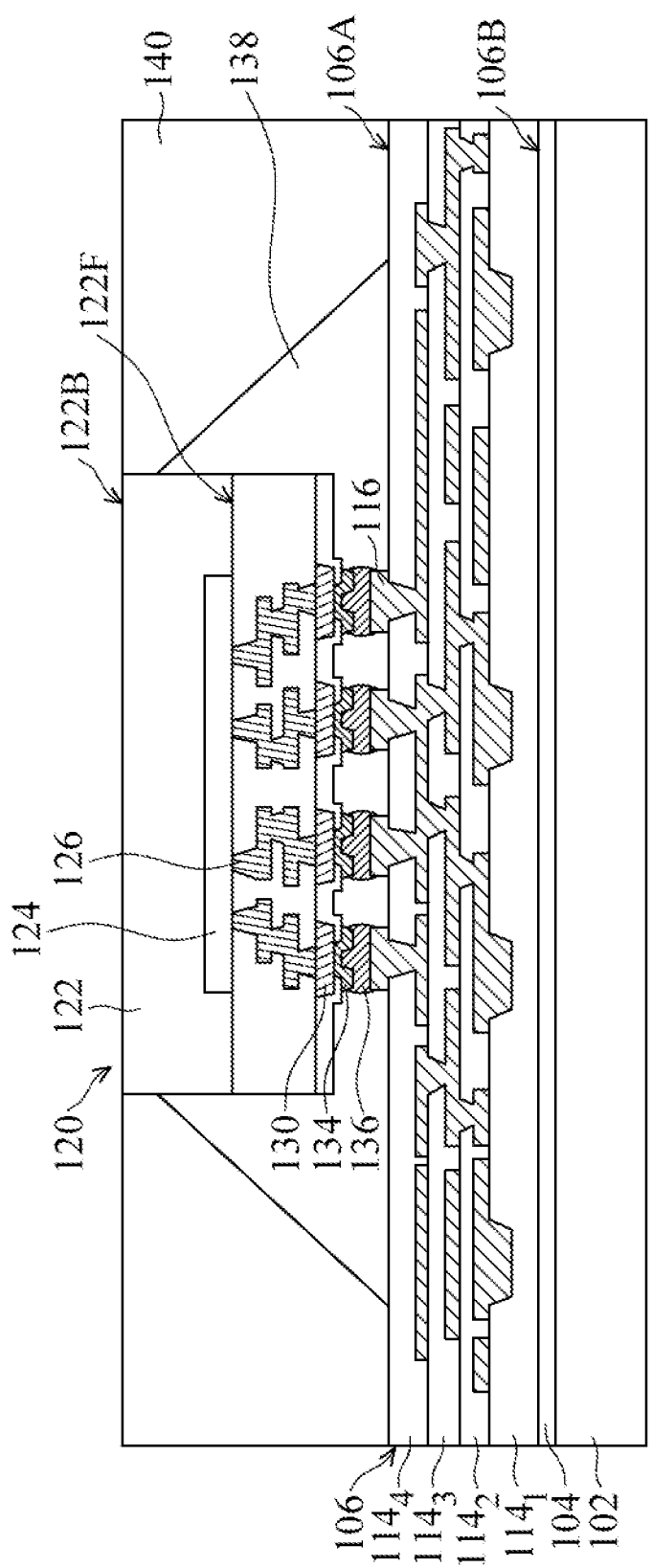

An underfill material 138 is formed over the top surface 106A of the redistribution structure 106, thereby encapsulating the semiconductor die 120, the under bump metallurgy structures 134, the bonding elements 136, and the under bump metallurgy structures 116, as shown in FIG. 1C, in accordance with some embodiments. The underfill material 138 fills the spacing between the bonding elements 136, in accordance with some embodiments. In some embodiments, an upper portion of the sidewalls of the semiconductor substrate 122 is not covered by the underfill material 138.

In some embodiments, the underfill material 138 is an electrically insulated adhesive for protecting the under bump metallurgy structures 134, the bonding elements 136 and the under bump metallurgy structures 116 and/or securing the semiconductor die 120. In some embodiments, the underfill material 138 is made of epoxy, resin, epoxy molding compounds, another suitable underfill material, and/or a combination thereof.

A molding compound 140 is formed over the top surface 106A of the redistribution structure 106, thereby encapsulating the underfill material 138 and the semiconductor die 120, as shown in FIG. 1C, in accordance with some embodiments. In some embodiments, the molding compound 140 is a single-layer film or a composite stack. In some embodiments, molding compound 140 includes various materials, such as molding underfill, epoxy, resin, or the like. In some embodiments, the molding compound 140 has high thermal conductivity, low moisture absorption rate and high flexural strength.

The molding compound 140 are then planarized until the backside surface 122B of the semiconductor substrate 122 is exposed, in accordance with some embodiments. The planarization processes may include a mechanical grinding process, a chemical mechanical polishing (CMP) process, a dry polishing process, one or more other applicable processes, or a combination thereof.

Figure 1D:
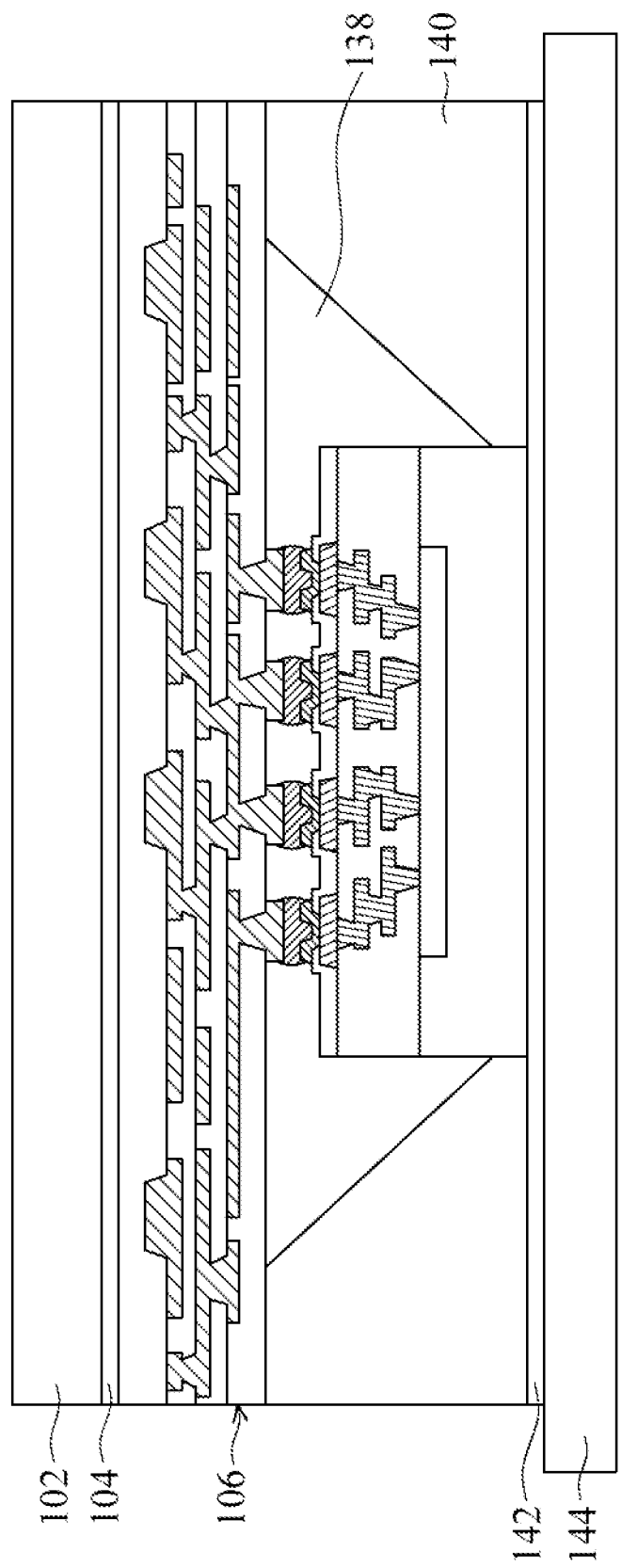

The upper surface (e.g., the backside surface 122B of the semiconductor substrate 122) of the structure of FIG. 1C is attached to a carrier substrate 144 and then flipped upside down, as shown in FIG. 1D, in accordance with some embodiments. The carrier substrate 144 is attached to the semiconductor substrate 122 and the molding compound 140 through an adhesive tape 142, thereby covering the semiconductor substrate 122 and the molding compound 140, in accordance with some embodiments. The carrier substrate 144 is configured to protect the semiconductor substrate 122 from being damaged during following processes, in accordance with some embodiments.

In some embodiments, the carrier substrate 144 is a ceramic substrate, a glass substrate, a polymer substrate, a semiconductor substrate, or another suitable substrate. In some embodiments, the adhesive tape 142 is a release layer that is made of or includes a light-to-heat conversion (LTHC) material. In some embodiments, the adhesive tape 142 is made of a different material than the adhesive tape 104.

Figure 1E:
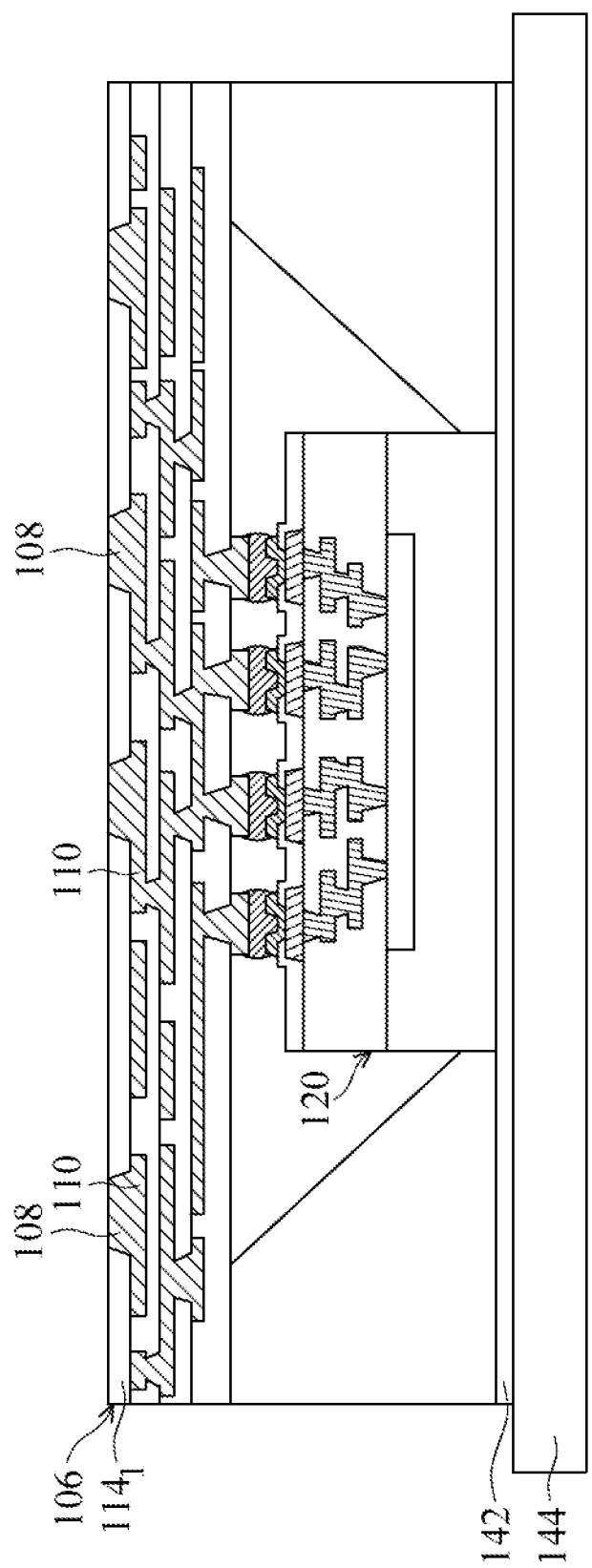

The carrier layer 102 is then taken away from the redistribution structure 106 by separating the adhesive tape 104 from the carrier layer 102 and the redistribution structure 106, as shown in FIG. 1E, in accordance with some embodiments. For example, a release process may be performed by irradiating the structure with an energy beam such as laser beam, an ultraviolet light, or another suitable energy beam. After the irradiation, the adhesive characteristics of the adhesive tape 104 may be destroyed or reduced. In some embodiments, the adhesive tape 142 may maintain adhesive even if being irradiated with the energy beam. After the release process, the insulating layer $114_1$ of the redistribution structure 106 is exposed, in accordance with some embodiments.

A planarization process is performed on the insulating layer $114_1$ of the redistribution structure 106 until the conductive vias 108 are exposed from the insulating layer $114_1$, as shown in FIG. 1E, in accordance with some embodiments. The planarization processes may include a mechanical grinding process, a chemical mechanical polishing (CMP) process, a dry polishing process, one or more other applicable processes, or a combination thereof.

Figure 1F:
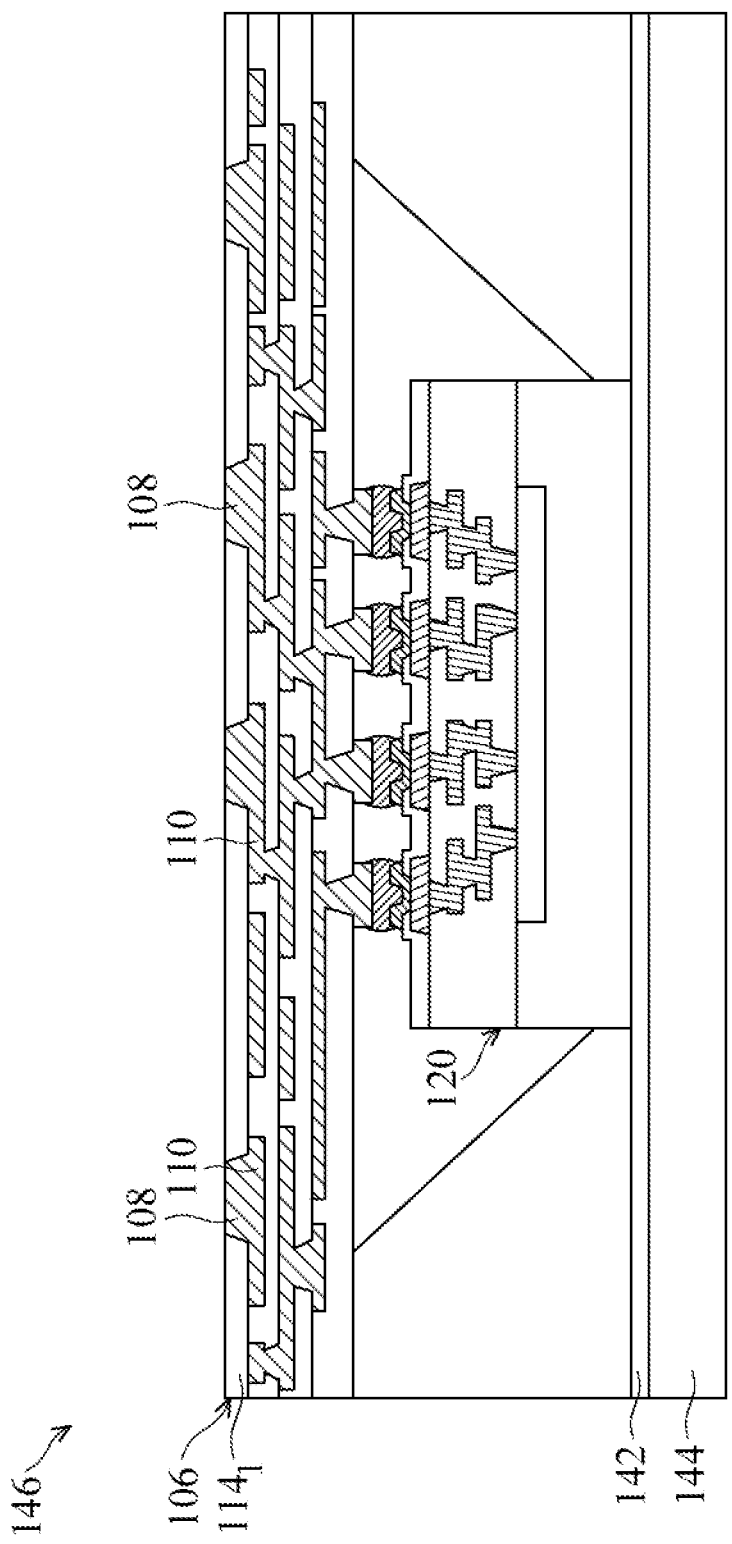

A sawing operation is performed to cut through the structure of FIG. 1E into multiple package structures 146 that are separated from one another, as shown in FIG. 1F, in accordance with some embodiments. FIG. 1F shows the cross-sectional view of one of the obtained package structures 146.

The carrier substrate 144 is then taken away from the package structure 146 by separating the adhesive tape 142 from the carrier substrate 144 and the semiconductor die 120 and the molding compound 140, in accordance with some embodiments. For example, a release process may be performed by irradiating the structure with an energy beam such as laser beam, an ultraviolet light, or another suitable energy beam. After the irradiation, the adhesive characteristics of the adhesive tape 142 may be destroyed or reduced.

Figure 1G:
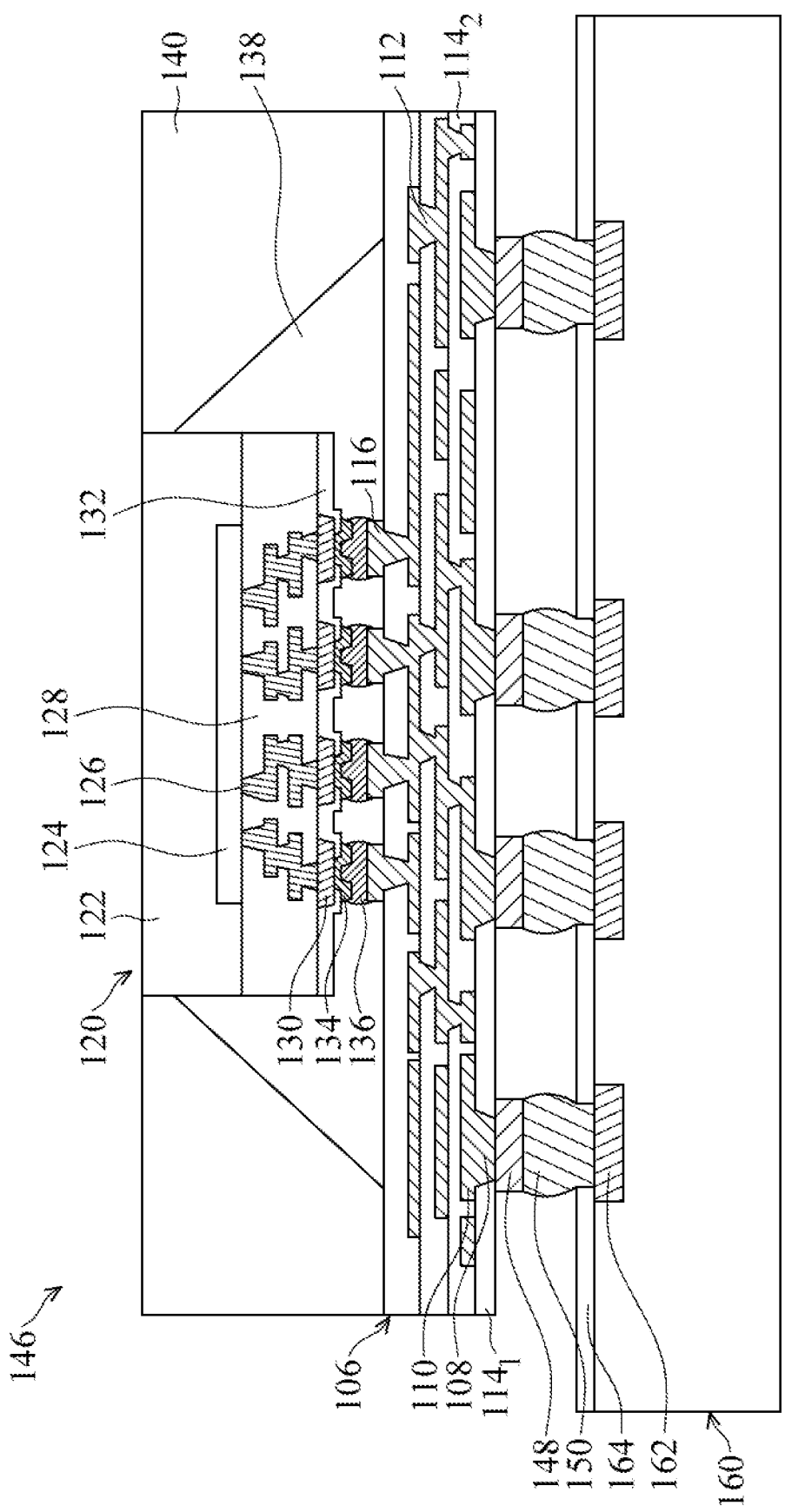

The package structure 146 is disposed over and bonded to a substrate 160 through bonding elements 150, as shown in FIG. 1G, in accordance with some embodiments. In some embodiments, the substrate 160 is a printed circuit board (PCB). In alternative embodiments, the substrate 160 is an interposer substrate that may then be bonded to another substrate. In some embodiments, the substrate 160 is fabricated with a predetermined functional circuit thereon. For example, the functional circuit may include conductive pad, conductive lines, conductive traces, conductive vias and/or active circuitry components such as transistor, diode, and the like. In some embodiments, the substrate 160 includes conductive pads 162 and a solder resist layer 164 partially covered the conductive pads 162. In some embodiments, the solder resist layer has openings exposing the conductive pads 162.

In some embodiments, the bonding process includes forming under bump metallurgy structures 148 over the conductive vias 108 exposed from the insulating layer $114_1$. In some embodiments, the under bump metallurgy structures 148 correspond and are in contact with the conductive vias 108.

In some embodiments, the under bump metallurgy structures 148 are used to hold or receive the bonding elements 150. UBM material may be used to increase adherence of solder (such as by providing solderability and wettability for solder, provide a solder diffusion barrier, provide some stress relief in the connection between the solder and the conductive vias 108, and provide low resistance in the contact to the conductive vias 108.

In some embodiments, the under bump metallurgy structures 148 are made of or include metallic material such as titanium, copper, nickel, tantalum, vanadium, chromium, gold, tungsten, an alloy thereof, a multi-layer thereof, or a combination thereof. In some embodiments, the under bump metallurgy structures 148 are made of non-solder metallic material. In some embodiments, the under bump metallurgy structures 148 are formed using sputtering, evaporation, plating, another suitable technique, and/or a combination thereof.

In some embodiments, an electroplating process is performed to form the bonding elements 150 over the under bump metallurgy structures 148. In alternative embodiments, the bonding elements 150 are pre-formed and placed over the conductive pads 162 of the substrate 160.

In some embodiments, the bonding elements 150 are solder joints, controlled collapse chip connection (C4) bumps, solder bumps, solder balls, ball grid array (BGA) balls, another suitable bonding elements, and/or a combination thereof. In some embodiments, the bonding elements 150 are tin-containing solder balls bumps or solder balls. The tin-containing solder bumps or balls may include copper, silver, gold, aluminum, lead, one or more other suitable materials, or a combination thereof. In some embodiments, the bonding elements 150 are lead-free.

The conductive vias 108 of the redistribution structure 106 of the package structure 146 are bonded to the conductive pad 162 of the substrate 160 through the under bump metallurgy structures 148 and the bonding elements 150, in accordance with some embodiments. In some embodiments, a thermal reflow operation is carried out. After the thermal process, lower portion of the bonding elements 150 are surrounded by the solder resist layer 164, in accordance with some embodiments. In some embodiments, the bonding elements 150 correspond to and connect the under bump metallurgy structures 148 and the conductive pad 162. As such, the integrated circuit 124 of the semiconductor die 120 is electrically coupled to the functional circuit of the substrate 160, in accordance with some embodiments.

Figures 1, 1G, 2:
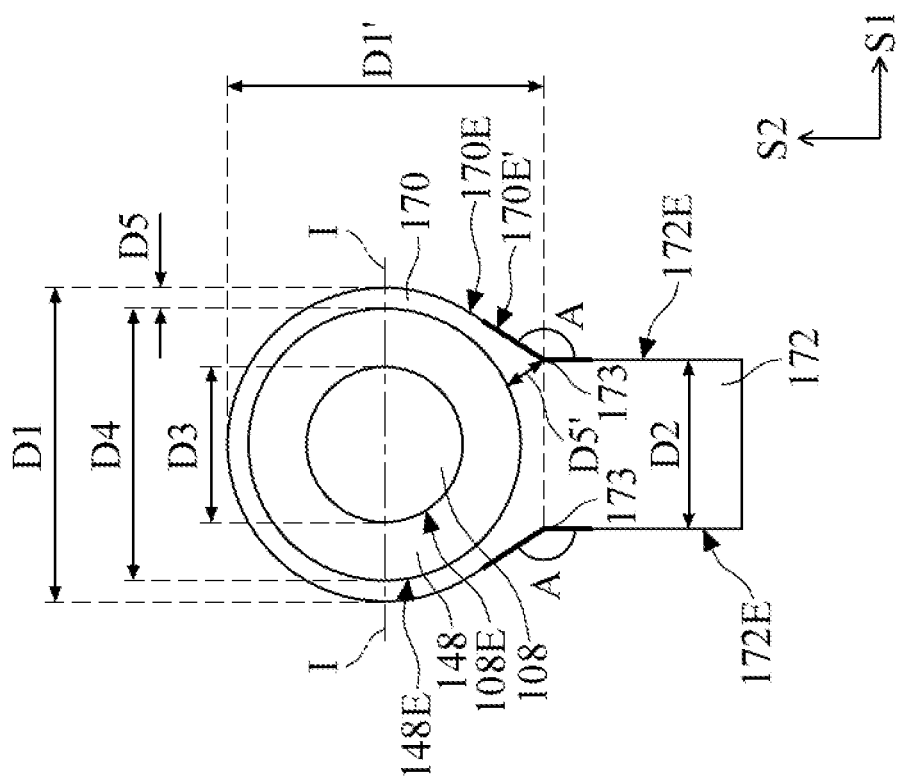
Figures 1, 1G:
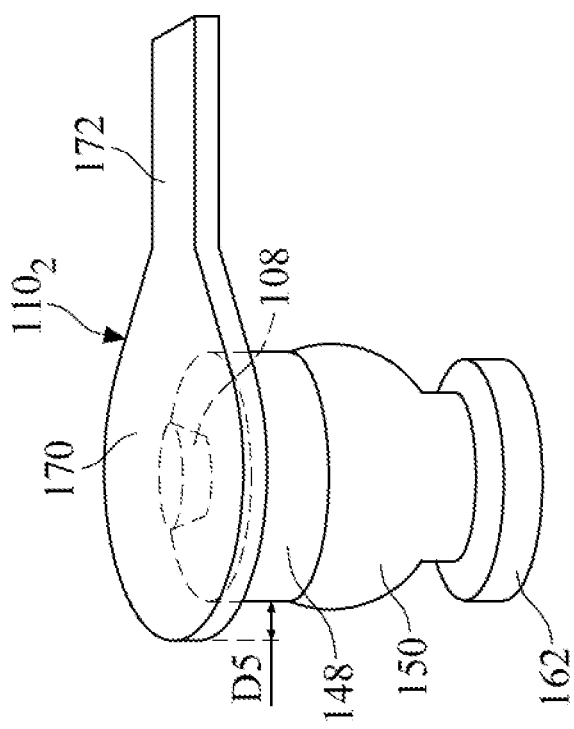

FIG. 1G-1 is a perspective view illustrating an under bump metallurgy structure 148 and components adjacent thereto, in accordance with some embodiments of the disclosure. FIG. 1G-1 illustrates a conductive line $110_2$ which is formed in the insulating layer $114_2$ (FIG. 1G) and includes a conductive pad 170 and a conductive trace 172. The conductive trace 172 is in connection with the conductive pad 170, in accordance with some embodiments. In some embodiments, the thickness of the conductive line $110_2$ is in a range from about 2 μm to about 6 μm.

A conductive via 108 formed in the insulating layer $114_1$ (FIG. 1G) is in contact with the overlying conductive pad 170 of the conductive line $110_2$, in accordance with some embodiments. The conductive via 108 is bonded to the conductive pad 162 of the substrate 160 through an under bump metallurgy structure 148 and a bonding element 150, in accordance with some embodiments. The conductive pad 170 of the conductive line $110_2$ entirely covers the under bump metallurgy structure 148, as shown in FIG. 1G-1, in accordance with some embodiments.

FIG. 1G-2 and FIG. 1G-3 are a plan view and a cross-sectional view of the structure shown in FIG. 1G-1 in that FIG. 1G-3 is taken along cross-section I-I shown in FIG. 1G-2, in accordance with some embodiments of the disclosure. FIG. 1G-2 illustrates footprints (or projections) of the conductive line $110_2$, the conductive via 108 and the under bump metallurgy structure 148, e.g., projected onto the main surface of the substrate 160. FIG. 1G-2 also illustrates horizontal directions S1 and S2. In some embodiments, the direction S1 is substantially perpendicular to the direction S2.

The conductive pad 170 has an edge 170E which is an approximately circular profile, as shown in FIG. 1G-2, in accordance with some embodiments. For example, a bulk portion of the edge 170E away from the conductive trace 172 may be an arc of a circle, the angle of which may be greater than about 180 degrees, 210 degrees, 240 degrees, or about 270 degrees. A connecting portion 170E' of the edge 170E near the conductive trace 172 may be linear and extends to an edge 172E of the conductive trace 172. The conductive trace 172 extends in the second direction S2, in accordance with some embodiments. That is, the longitudinal axis of the conductive trace 172 is parallel to the second direction S2.

The edge 172E of the conductive trace 172 and the connecting portion 170E' of the edge 170E of the conductive pad 170 intersect at an intersection point 173, in accordance with some embodiments. In some embodiments, an angle A between the edge 172E and the connecting portion 170E' of the edge 170E is an obtuse angle which is in a range from about 100 degrees to about 170 degrees. The connection of two intersection points 173 defines the area of the conductive pad 170 and the area of the conductive trace 172.

In some embodiments, the conductive pad 170 has a maximum width D1 (e.g., the diameter of an imaginary circle that satisfies the arc described-above) as measured along the first direction S1. The width D1 is in a range from about 72 μm to about 120 μm. In some embodiments, the conductive pad 170 has a maximum width D1' as measured along the second direction S2. The width D1' may be equal to or greater than the width D1 and is in a range from about 74 μm to about 180 μm. If the width D1' less than the width D1, a concentrated stress induced by the under bump metallurgy structure 148 not be effectively mitigated, thereby increasing the risk of cracking the insulating layer 114.

In some embodiments, the conductive trace 172 has a width D2 as measured along the first direction S1. The width D2 is substantially consistent along the second direction S2. In some embodiments, the width D2 is less than the width D1 and is in a range from about 5 μm to about 96 μm. In some embodiments, the ratio of the width D2 to the width D1 is in a range from about 0.06 to about 0.8.

The conductive via 108 has an edge 108E which is a circular profile, as shown in FIG. 1G-2, in accordance with some embodiments. In FIG. 1G-2, the area of the conductive via 108 is confined within the area of the conductive pad 170, in accordance with some embodiments. In some embodiments, the conductive via 108 has a maximum width D3 (e.g., the diameter of the circular profile) as measured along the first direction S1 and the second direction S2.

In some embodiments, the width D3 is less than the width D1 and is in a range from about 22 μm to about 96 μm. In some embodiments, the ratio of the width D3 to the width D1 is in a range from about 0.3 to about 0.8.

The under bump metallurgy structure 148 has an edge 148E which is a circular profile, as shown in FIG. 1G-2, in accordance with some embodiments. In FIG. 1G-2, the area of the under bump metallurgy structure 148 is confined within the area of the conductive pad 170, and the area of the conductive via 108 is confined within the area of the under bump metallurgy structure 148, in accordance with some embodiments. If the area of the conductive via 108 has a portion outside of the area of the conductive pad 170, a concentrated stress induced by the under bump metallurgy structure 148 not be effectively mitigated, thereby increasing the risk of cracking the insulating layer 114.

In some embodiments, the under bump metallurgy structure 148 has a maximum width D4 (e.g., the diameter of the circular profile) as measured along the first direction S1 and the second direction S2. In some embodiments, the width D4 is less than the width D1 and greater than the width D3. In some embodiments, the width D4 is in a range from about 70 μm to about 100 μm. In some embodiments, the ratio of the width D4 to the width D1 is in a range from about 0.75 to about 0.97. In some embodiments, the width D2 of the conductive trace 172 is less than the width D4 of the under bump metallurgy structure 148 and greater than the width D3 of the conductive via 108.

In some embodiments, the circular profile of the under bump metallurgy structure 148, the circular profile of the conductive via 108 and the imaginary circle of the conductive pad 170 may have a common center.

The conductive pad 170 entirely covers the under bump metallurgy structure 148, as shown in FIGS. 1G-1, 1G-2 and 1G-3, in accordance with some embodiments. In any horizontal direction, the edge 170E of the conductive pad 170 exceeds the edge 148E of the under bump metallurgy structure 148. In some embodiments, the edge 170E exceeds the edge 148E by a distance D5. The distance D5 may be greater than 1 µm, e.g., in a range from about 1 µm to about 10 µm. At the intersection point 173, the edge 170E exceeds the edge 148E by a maximum distance D5'.

A large difference of coefficients of thermal expansion (CTE) may exist between the substrate 160 and the semiconductor die 120, and thus a tensile stress may be induced and applied to the insulating layers 114 of the redistribution structure 106 during reliability tests, operations of the package structure and/or thermal processes. Because the bonding elements 150 are more rigid than neighboring components, the tensile stress may be concentrated, especially at the corners of the under bump metallurgy structures 148 contacting the insulating layer $114_1$. The concentration of the tensile stress may cause the formation and propagation of cracks within the insulating layers 114 of the redistribution structure 106.

In accordance with the embodiments of the present disclosure, the corner of the under bump metallurgy structure 148 contacting the insulating layer $114_1$ is entirely covered by conductive pad 170 of the conductive line $110_2$, thereby reducing or mitigating the tensile stress concentrated at the corner of the under bump metallurgy structure 148. As a result, the risk of cracking the insulating layers 114 of the redistribution structure 106 may be reduced, improving the performance and reliability of the package structure.

For example, if the ratio of the width D4 to the width D1 is too low (or the width D1 is too large), it may reduce the density of routing of the resulting package structure. If the ratio of the width D4 to the width D1 is too high (or the width D1 is too small), the concentrated stress may not be effectively mitigated, thereby increasing the risk of cracking the insulating layer 114.

Figures 1, 1G, 2, 3:
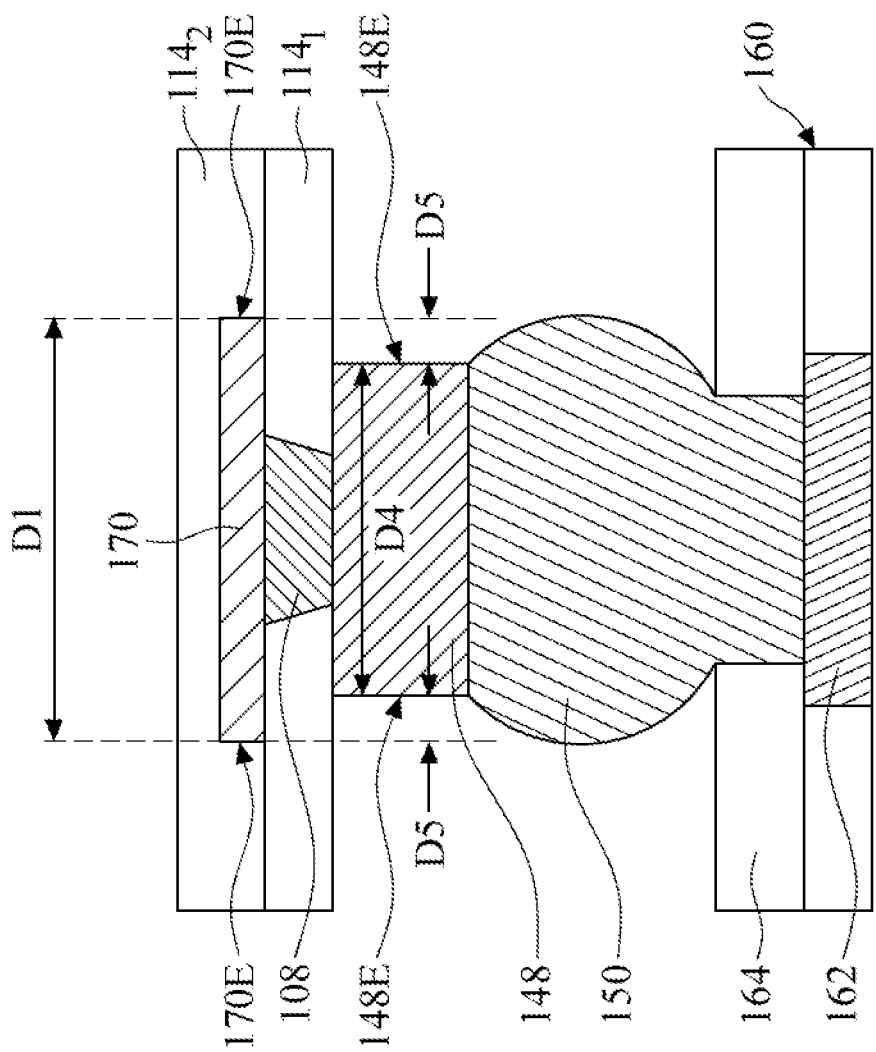
Figure 1H:
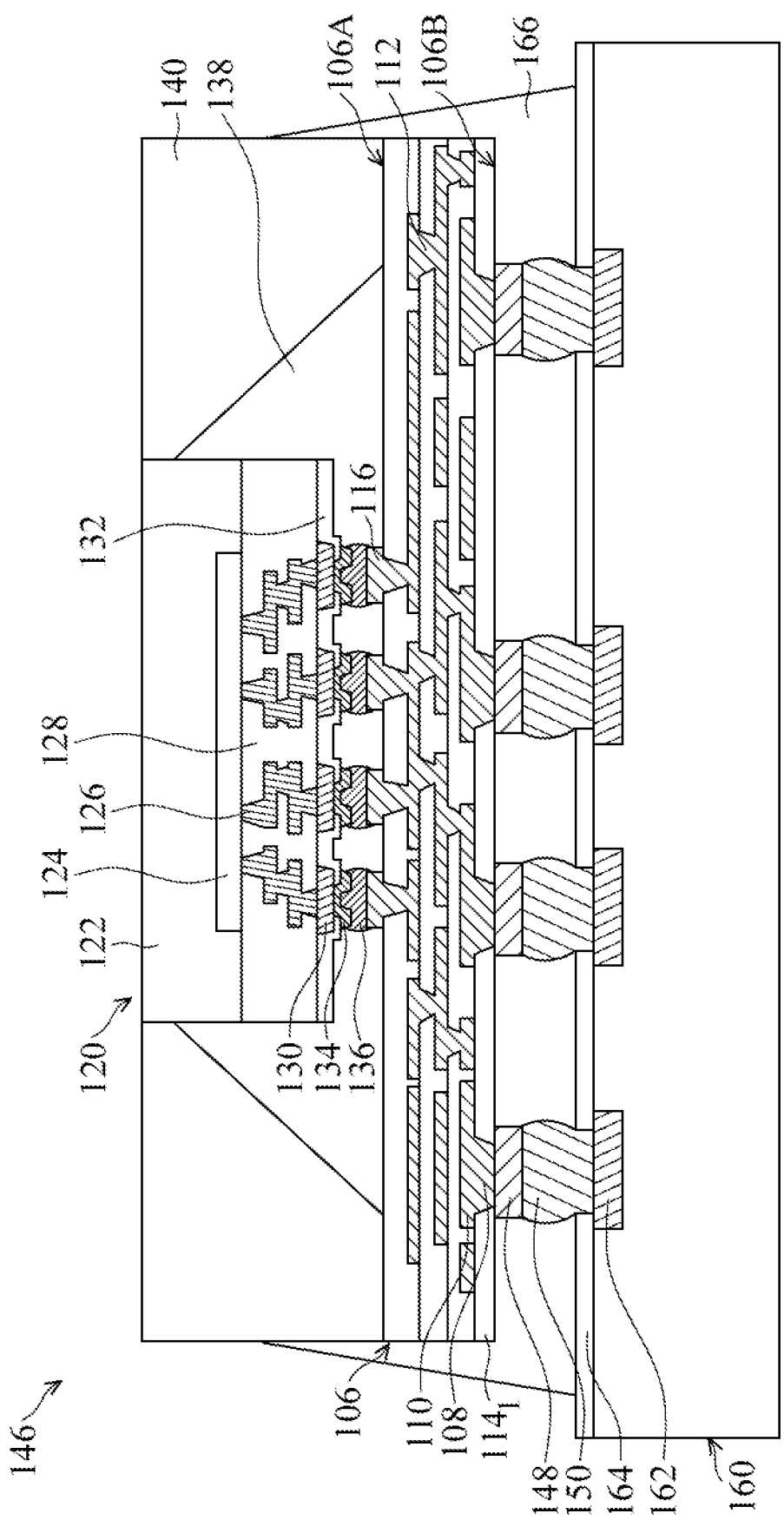
Figures 1, 2:
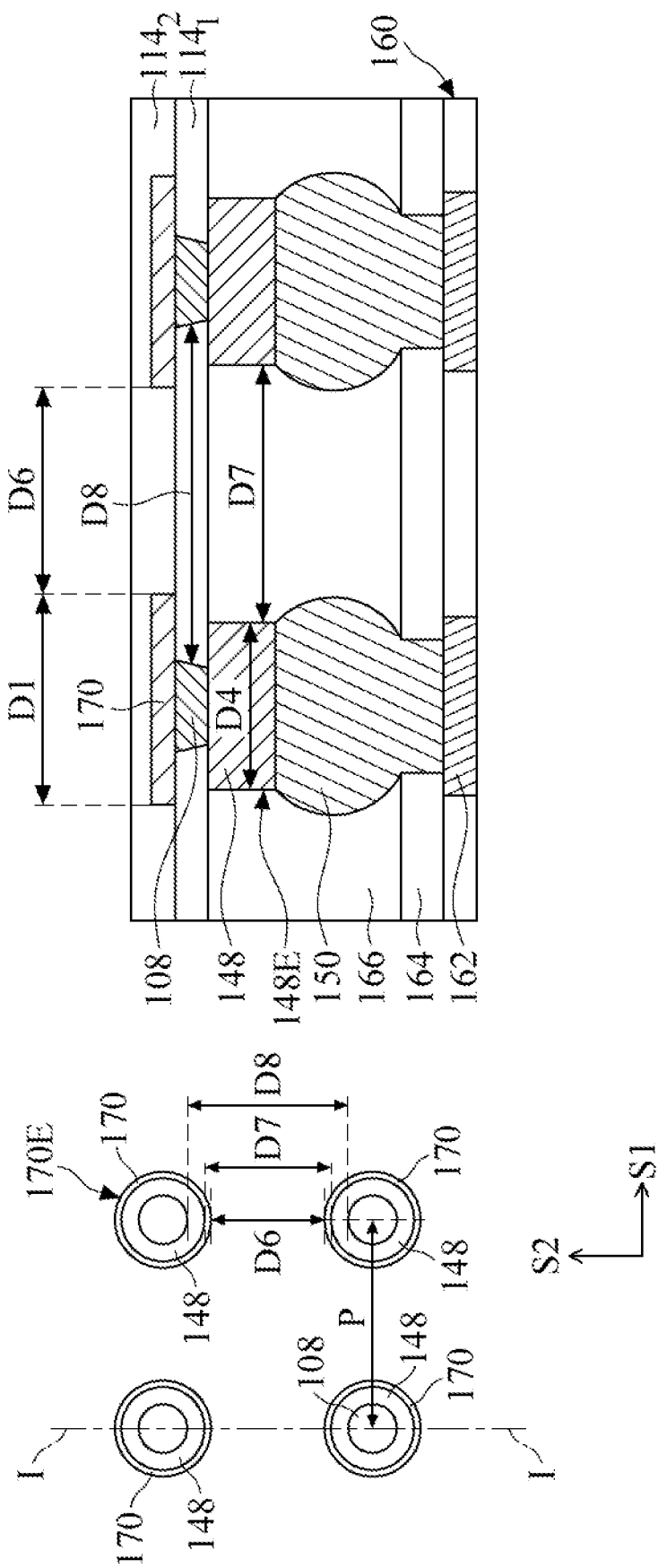
Figures 1, 2, 3:
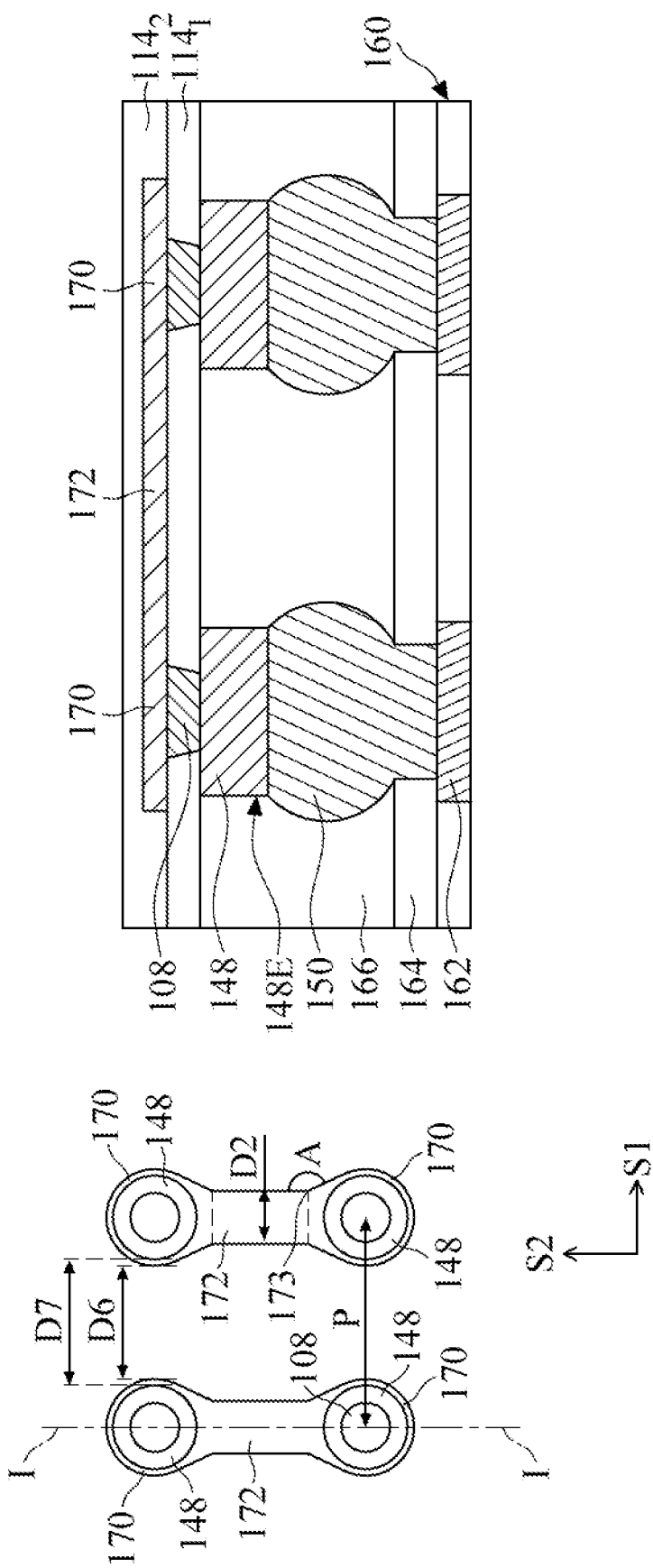

An underfill material 166 is formed over the upper surface of the substrate 160 and encapsulates the package structure 146, the under bump metallurgy structures 148, and the bonding elements 150, as shown in FIG. 1H, in accordance with some embodiments. The underfill material 166 fills the spacing between the bonding elements 150, in accordance with some embodiments. The underfill material 166 covers the sidewalls of the molding compound 140 and the sidewalls of the redistribution structure 106, in accordance with some embodiments. After the underfill material 166 is formed, a package structure is produced, in accordance with some embodiments.

In some embodiments, the underfill material 166 is an electrically insulated adhesive for protecting the bonding elements 150 and/or securing the package structure 146. In some embodiments, the underfill material 166 is made of epoxy, resin, epoxy molding compounds, another suitable underfill material, and/or a combination thereof.

FIG. 2-1 and FIG. 2-2 are a plan view and a cross-sectional view illustrating an under bump metallurgy structure 148 and components adjacent thereto in that FIG. 2-2 is taken along cross-section I-I shown in FIG. 2-1, in accordance with some embodiments of the disclosure. The components shown in FIG. 2-1 and FIG. 2-2 are similar to those shown in FIG. 1G-2 and FIG. 1G-3, except without the conductive trace 172 shown in FIGS. 1G-1 and 1G-2.

FIG. 2-1 illustrates four conductive pads 170 isolated from one another, in accordance with some embodiments. The conductive pad 170 has an edge 170E which is a circular profile, as shown in FIG. 2-1, in accordance with some embodiments. In FIG. 2-1, the area of the under bump metallurgy structure 148 is confined within the area of the conductive pad 170, the area of the conductive via 108 is confined within the area of the under bump metallurgy structure 148, in accordance with some embodiments.

In some embodiments, the circular profile of the under bump metallurgy structure 148, the circular profile of the conductive via 108 and the circular profile of the conductive pad 170 may have a common center.

In some embodiments, a pitch P of the under bump metallurgy structures 148 (or the conductive vias 108, or the conductive pads 170) may be in a range from about 130 µm to about 220 µm. In some embodiments, adjacent conductive pads 170 are spaced apart from one another by a distance D6 in a range from about 15 µm to about 146 µm. In some embodiments, adjacent under bump metallurgy structures 148 are spaced apart from one another by a distance D7 in a range from 30 µm to about 150 µm. In some embodiments, the distance D6 is less than the distance D7.

In some embodiments, adjacent conductive vias 108 are spaced apart from one another by a distance D8 in a range from 34 µm to about 198 µm. In some embodiments, the distance D8 is greater than the distance D7.

FIG. 3-1 and FIG. 3-2 are a plan view and a cross-sectional view illustrating an under bump metallurgy structure 148 and components adjacent thereto in that FIG. 3-2 is taken along cross-section I-I shown in FIG. 3-1, in accordance with some embodiments of the disclosure. The components shown in FIG. 3-1 and FIG. 3-2 are similar to those shown in FIG. 2-1 and FIG. 2-2, except that a conductive trace 172 connects two adjacent conductive pads 170.

A conductive line $110_2$ includes a conductive trace 172 interposing two adjacent conductive pads 170, as shown in FIGS. 3-1 and 3-2, in accordance with some embodiments of the disclosure. The conductive trace 172 extends along the second direction S2 and is electrically coupled to the conductive pads 170, in accordance with some embodiments of the disclosure.

FIG. 4-1 and FIG. 4-2 are a plan view and a cross-sectional view illustrating an under bump metallurgy structure 148 and components adjacent thereto in that FIG. 4-2 is taken along cross-section I-I shown in FIG. 4-1, in accordance with some embodiments of the disclosure. The components shown in FIG. 4-1 and FIG. 4-2 are similar to those shown in FIG. 3-1 and FIG. 3-2, except that a conductive trace 172 connects two non-adjacent conductive pads 170.

A conductive line $110_2$ includes a conductive trace 172 which bypasses one conductive pad 170 to connect two non-adjacent conductive pads 170, as shown in FIG. 4-1, in accordance with some embodiments of the disclosure. The conductive trace 172 may include several segments extending in different directions.

The conductive trace 172 extends between adjacent two conductive pads 170, in accordance with some embodiments of the disclosure. In some embodiments, a width D2' of the conductive trace 172 is limited by the distance D6 between adjacent conductive pads 170. The width D2' may be less than the width D2 of the conductive trace 172 shown in FIG. 1G-2.

For example, the conductive trace 172 includes a segment which extends in the second direction S2 and between the adjacent two conductive pads 170. In FIG. 4-1, the segment of the conductive trace 172 is spaced apart from the under bump metallurgy structure 148 by a distance D9. In FIG. 4-1, the segment of the conductive trace 172 is spaced apart from the conductive pad 170 by a distance D10 that is less than the distance D9.

Figures 1, 2, 5:
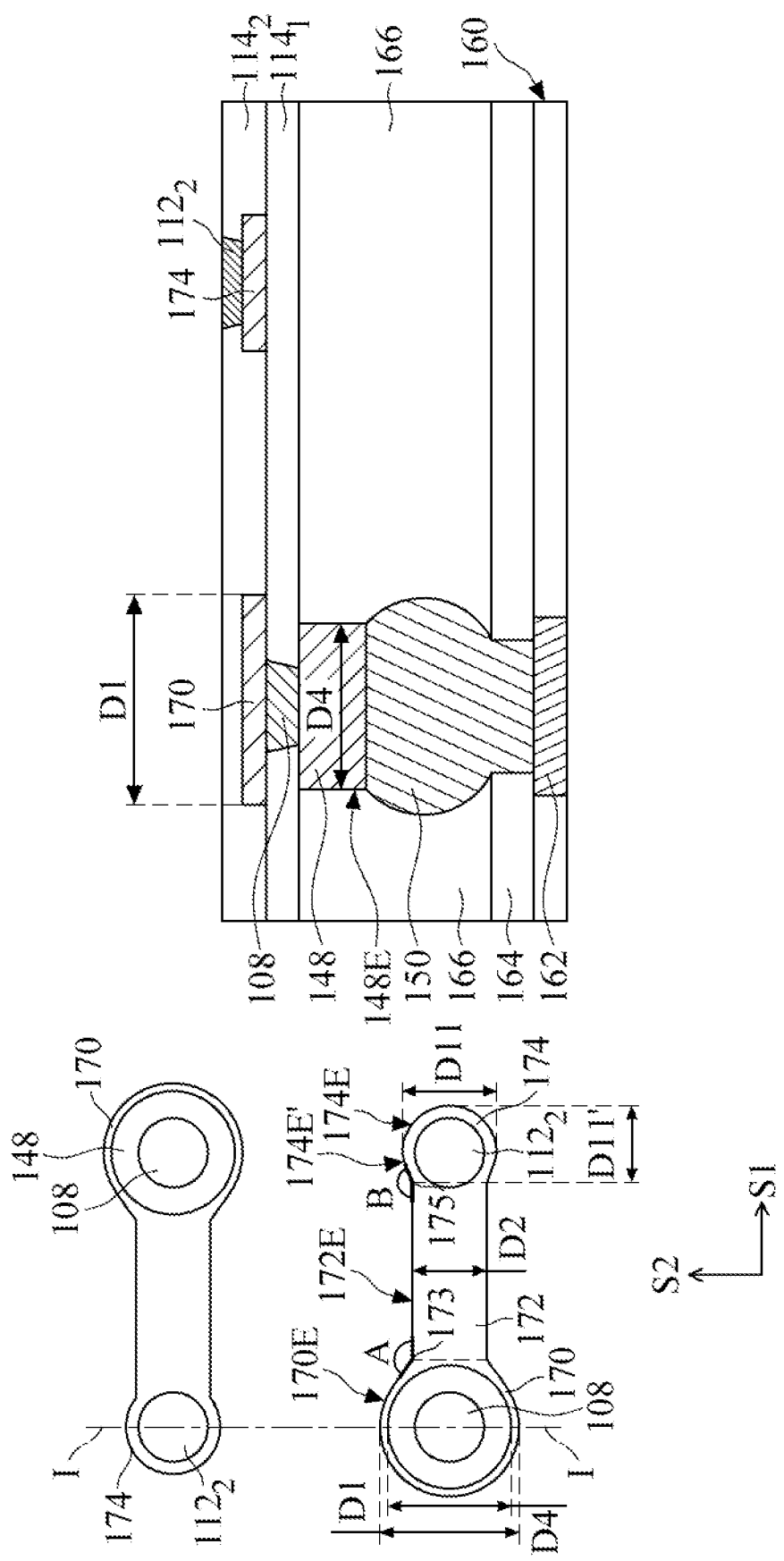

FIG. 5-1 and FIG. 5-2 are a plan view and a cross-sectional view illustrating an under bump metallurgy structure 148 and components adjacent thereto in that FIG. 5-2 is taken along cross-section I-I shown in FIG. 5-1, in accordance with some embodiments of the disclosure. The components shown in FIG. 5-1 and FIG. 5-2 are similar to those shown in FIG. 3-1 and FIG. 3-2, except that a conductive trace 172 connects a conductive pad 170 and a conductive pad 174.

A conductive line $110_2$ includes a conductive trace 172 interposing a conductive pad 170 and a conductive pad 174, as shown in FIG. 5-1, in accordance with some embodiments of the disclosure. The conductive trace 172 extends in the first direction S1 and is electrically coupled to the conductive pad 170 and the conductive pad 174, in accordance with some embodiments of the disclosure.

None of the conductive via 108 is formed directly under the conductive pad 174, as shown in FIG. 5-2, in accordance with some embodiments. A conductive via $112_2$ formed in the insulating layer $114_2$ lands on the conductive pad 174, in accordance with some embodiments.

The conductive pad 174 has an edge 174E which is an approximately circular profile, in accordance with some embodiments. For example, a bulk portion of the edge 174E away from the conductive trace 172 may be an arc of a circle, the angle of which may be greater than about 180 degrees, 210 degrees, 240 degrees, or about 270 degrees. A connecting portion 174E' of the edge 174E near the conductive trace 172 may be linear and extends to the edge 172E of the conductive trace 172. In some embodiments, the edge 174E may have no linear connecting portion 174E'.

The edge 172E of the conductive trace 172 and the connecting portion 174E' of the edge 174E of the conductive pad 174 intersect at an intersection point 175, in accordance with some embodiments. In some embodiments, an angle B between the edge 172E of the conductive trace 172 and the connecting portion 174E' of the edge 174E is in a range from about 100 degrees to about 170 degrees. The angle B may be equal to or greater than the angle A. The connection of two intersection points 175 defines the area of the conductive pad 174 and the area of the conductive trace 172. In FIG. 5-2, the area of the conductive via $112_2$ partially overlaps the area of the conductive pad 174 and the area of the conductive trace 172.

In some embodiments, the conductive pad 174 has a maximum width D11 (e.g., the diameter of the imaginary circle that satisfies the arc described-above) as measured along the second direction S2. In some embodiments, the width D11 of the conductive pad 174 is less than the width D1 of the conductive pad 170 and the width D4 of the under bump metallurgy structure 148 and greater than the width D3 of the conductive via 108. In some embodiments, the ratio of the width D11 to the width D1 is in a range from about 0.35 to about 0.9.

In some embodiments, the conductive pad 174 has a maximum width of D11' as measured along the first direction S1. The width D11' may be less than the width D11.

FIG. 6-1 and FIG. 6-2 are a plan view and a cross-sectional view illustrating an under bump metallurgy structure 148 and components adjacent thereto in that FIG. 6-2 is taken along cross-section I-I shown in FIG. 6-1, in accordance with some embodiments of the disclosure. The components shown in FIG. 6-1 and FIG. 6-2 are similar to those shown in FIG. 2-1 and FIG. 2-2, except that FIG. 6-1 also illustrates footprints of bonding elements 150.

The bonding element 150 has an edge 150E which is a circular profile, as shown in FIG. 6-1, in accordance with some embodiments. In FIG. 6-1, the area of the conductive pad 170 is confined within the area of the bonding element 150, in accordance with some embodiments.

In some embodiments, the bonding element 150 has a maximum width D12 (e.g., the diameter of the circular profile) as measured along the first direction S1 and the second direction S2. The width D12 is greater than the width D1. In some embodiments, adjacent bonding elements 150 are spaced apart from one another by a distance D13. In some embodiments, the distance D13 is less than the distance D6 between adjacent conductive pads 170.

In some embodiments, the circular profile of the bonding element 150, the circular profile of the under bump metallurgy structure 148, the circular profile of the conductive via 108 and the circular profile of the conductive pad 170 may have a common center.

Figures 2, 7:
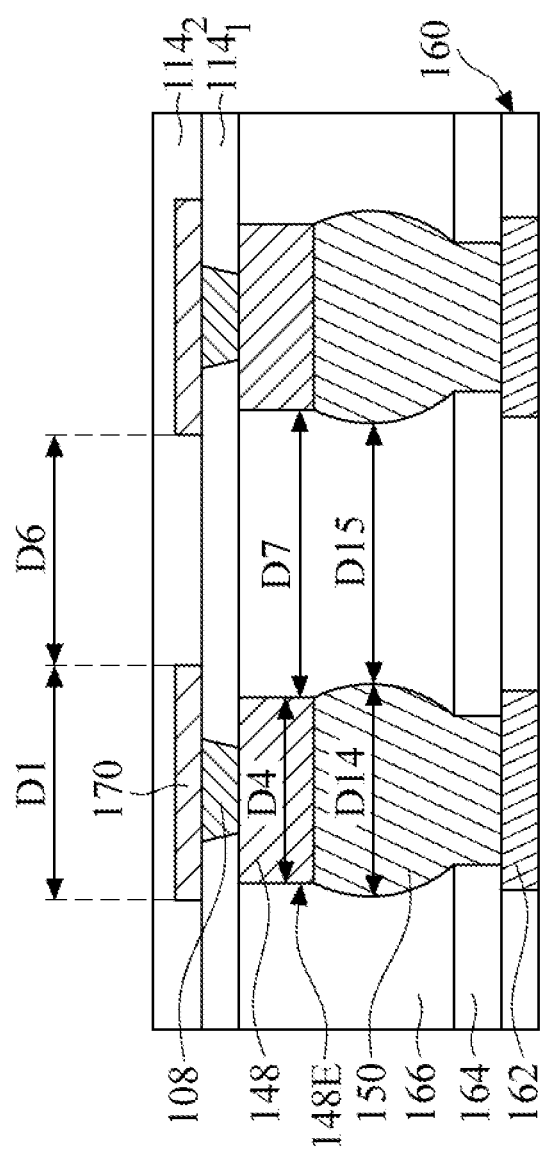
Figures 1, 7:
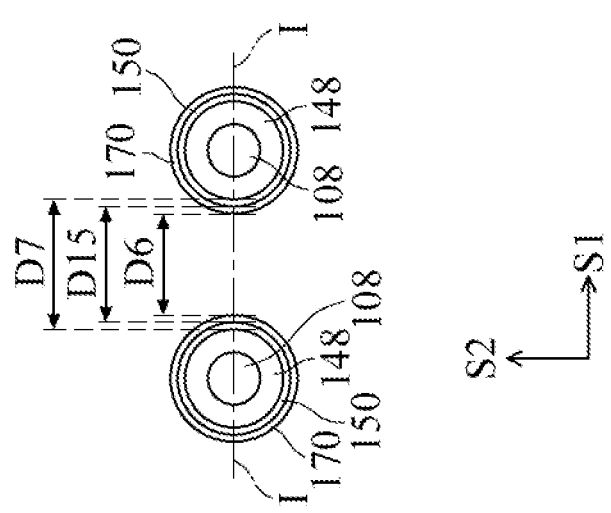

FIG. 7-1 and FIG. 7-2 are a plan view and a cross-sectional view illustrating an under bump metallurgy structure 148 and components adjacent thereto in that FIG. 7-2 is taken along cross-section I-I shown in FIG. 7-1, in accordance with some embodiments of the disclosure. The components shown in FIG. 7-1 and FIG. 7-2 are similar to those shown in FIG. 6-1 and FIG. 6-2, except for the size of the bonding elements 150.

In FIG. 7-1, the area of the bonding element 150 is confined within the area of the conductive pad 170, in accordance with some embodiments. In some embodiments, the bonding element 150 has a maximum width D14 (e.g., the diameter of the circular profile) as measured along the first direction S1 and the second direction S2. The width D14 is less than the width D1 of the conductive pad 170 and greater than width D4 of the under bump metallurgy structure 148.

In some embodiments, adjacent bonding elements 150 are spaced apart from one another by a distance D15. In some embodiments, the distance D15 is less than the distance D7 between adjacent under bump metallurgy structures 148 and greater than the distance D6 between adjacent conductive pads 170.

Figure 8:
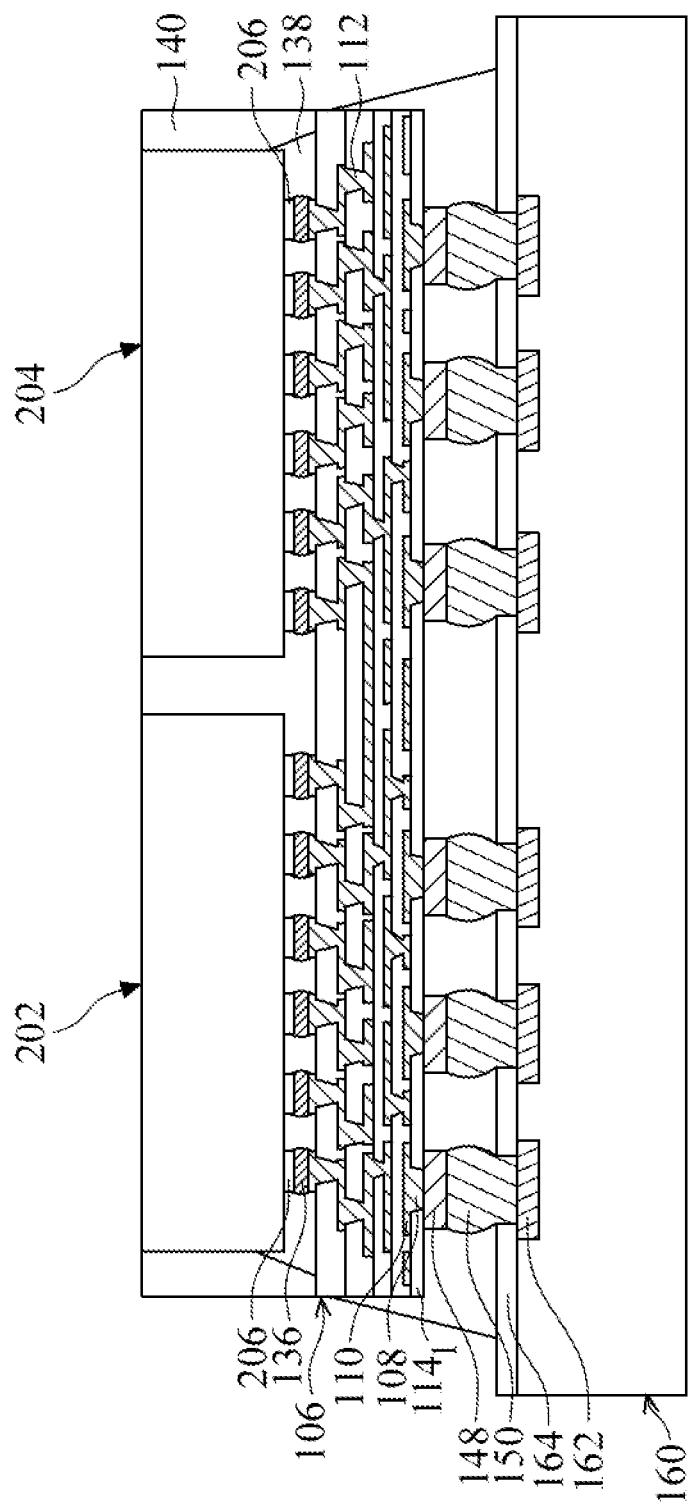
FIG. 8 is a modification of the cross-sectional view illustrated in FIG. 1H, in accordance with some embodiments of the disclosure.

FIG. 8 is a modification of the cross-sectional view illustrated in FIG. 1H, in accordance with some embodiments of the disclosure. FIG. 8 illustrates package components 202 and 204 disposed over the top surface 106A of the redistribution structure 106. Each of the package components 202 and 204 includes conductive pads 206 which are bonded to the metallurgy structures 116 through the bonding elements 136, in accordance with some embodiments.

In some embodiments, the package components 202 and 204 are similar to the semiconductor dies 120 described with respect to FIG. 1B. In some embodiments, the package components 202 and 204 are chip-scale packages (CSP), chip on wafer on substrate (CoWoS) packages, system on integrated chip (SoIC) packages, and/or a three dimensional integrated circuits (3CIC). In some embodiments, the package components 202 and 204 include high bandwidth memory (HBM) devices. In some embodiments, the package components 202 and 204 may be different. For example, the package component 202 may include memory device, and the package component 204 may include system-on-chip (SoC) device.

As described above, the embodiments of the present disclosure provide a package structure. The package structure includes the conductive pad 170, the under bump metallurgy structure 148, and the conductive via 108 connecting the conductive pad 170 and the under bump metallurgy structure 148. The conductive pad 170 entirely covers the corner of the under bump metallurgy structure 148 contacting the insulating layer $114_1$, thereby reducing or mitigating the tensile stress concentrated at the corner of the under bump metallurgy structure 148. As a result, the risk of cracking the insulating layer 114 may be reduced, improving the performance and reliability of the package structure.

Embodiments of a package structure may be provided. The package structure may include a first conductive pad, a first under bump metallurgy structure under the insulating layer, and first conductive via vertically connected to the first conductive pad and the first under bump metallurgy structure. In a plan view, a first area of the first under bump metallurgy structure may be confined within a second area of the first conductive pad. Therefore, a tensile stress that is concentrated at the corner of the under bump metallurgy structure may be reduced. As a result, the risk of cracking the insulating layer may be reduced, improving the performance and reliability of the package structure.

In some embodiments, a package structure is provided. The package structure includes a first conductive pad in an insulating layer, a first under bump metallurgy structure under the insulating layer, and a first conductive via in the insulating layer. The first conductive via is vertically connected to the first conductive pad and the first under bump metallurgy structure. In a plan view, a first area of the first under bump metallurgy structure is confined within a second area of the first conductive pad.

In some embodiments, a package structure is provided. The package structure includes a semiconductor die over a redistribution structure, a bonding element under a first conductive pad of the redistribution structure, and an under bump metallurgy structure sandwiched between the first conductive pad and the bonding element. As measured along a first direction, a first width of the under bump metallurgy structure is less than a second width of the first conductive pad. As measured along a second direction perpendicular to the first direction, a third width of the under bump metallurgy structure is less than a fourth width of the first conductive pad.

In some embodiments, a package structure is provided. The package structure includes an insulating layer over an underfill material, a first under bump metallurgy structure and a second under bump metallurgy structure embedded in the underfill material, and a first conductive pad and a second conductive pad embedded in the insulating layer. The first conductive pad covers the first under bump metallurgy structure. The second conductive pad covers the second under bump metallurgy structure. A first distance between the first conductive pad and the second conductive pad is less than a second distance between the first under bump metallurgy structure and the second under bump metallurgy structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a first conductive pad in an insulating layer;
   a first under bump metallurgy structure under the insulating layer, wherein in a plan view, a first area of the first under bump metallurgy structure is confined within a second area of the first conductive pad; and
   a first conductive via in the insulating layer and vertically connected to the first conductive pad and the first under bump metallurgy structure, wherein the first under bump metallurgy structure is in direct contact with the first conductive via at a first interface.

2. The package structure as claimed in claim 1, wherein in a plan view, a third area of the first conductive via is confined within the first area of the first under bump metallurgy structure.

3. The package structure as claimed in claim 1, wherein in a plan view, an edge of the first under bump metallurgy structure is entirely covered by the first conductive pad.

4. The package structure as claimed in claim 1, further comprising:
   a second conductive pad in the insulating layer and spaced apart from the first conductive pad by a first distance;
   a second under bump metallurgy structure under the insulating layer and spaced apart from the first under bump metallurgy structure by a second distance that is greater than the first distance, wherein in a plan view, a third area of the second under bump metallurgy structure is confined within a fourth area of the second conductive pad; and
   a second conductive via in the insulating layer and vertically connected to the second conductive pad and the second under bump metallurgy structure.

5. The package structure as claimed in claim 1, further comprising:
   a semiconductor die over the insulating layer; and
   a substrate under the first under bump metallurgy structure and electrically coupled to the semiconductor die through the first under bump metallurgy structure, the first conductive via and the first conductive pad.

6. The package structure as claimed in claim 1, further comprising:
   a bonding element under the first under bump metallurgy structure;
   an underfill material surrounding an upper portion of the bonding element and the first under bump metallurgy structure; and
   a solder resist layer surrounding a lower portion of the bonding element.

7. The package structure as claimed in claim 6, wherein in a plan view, the second area of the first conductive pad is confined within a third area of the bonding element.

8. The package structure as claimed in claim 1, wherein the first under bump metallurgy structure is in direct contact with the insulating layer at a second interface, and the first interface is substantially leveled with the second interface.

9. A package structure, comprising:
   a semiconductor die over a redistribution structure;
   a bonding element under a first conductive pad of the redistribution structure; and
   an under bump metallurgy structure sandwiched between the first conductive pad and the bonding element, wherein as measured along a first direction, a first width of the under bump metallurgy structure is less than a second width of the first conductive pad, and as measured along a second direction perpendicular to the first direction, a third width of the under bump metallurgy structure is less than a fourth width of the first conductive pad, wherein a conductive trace of the redistribution structure is in connection with the first conductive pad of the redistribution structure and a second conductive pad of the redistribution structure, wherein as measured along the first direction, a fifth width of the second conductive pad is less than the first width of the under bump metallurgy structure.

10. The package structure as claimed in claim 9, further comprising:
a conductive via sandwiched between the first conductive pad and the under bump metallurgy structure, wherein as measured along the first direction, a sixth width of the conductive via is less than the first width of the under bump metallurgy structure.

11. The package structure as claimed in claim 9, wherein as measured along the first direction, the conductive trace has a sixth width that is substantially consistent along a longitudinal axis of the conductive trace and less than the second width of the first conductive pad.

12. The package structure as claimed in claim 11, wherein a first edge of the conductive trace intersects a second edge of the first conductive pad at an intersection point, and in a plan view, the intersection point is located outside of the under bump metallurgy structure.

13. The package structure as claimed in claim 12, wherein an angle between the first edge and the second edge is an obtuse angle.

14. The package structure as claimed in claim 9, wherein a conductive via of the redistribution structure is located above and in connection with the second conductive pad.

15. The package structure as claimed in claim 9, further comprising:
an underfill material encapsulating the under bump metallurgy structure and the bonding element; and
a substrate under the underfill material.

16. The package structure as claimed in claim 15, wherein the first conductive pad of the redistribution structure is electrically connected to the substrate, and the second conductive pad of the redistribution structure is electrically isolated from the substrate.

17. A package structure, comprising:
an insulating layer over an underfill material;
a first under bump metallurgy structure and a second under bump metallurgy structure embedded in the underfill material;
a first conductive pad and a second conductive pad embedded in the insulating layer, wherein the first conductive pad covers the first under bump metallurgy structure, the second conductive pad covers the second under bump metallurgy structure, and a first distance between the first conductive pad and the second conductive pad is less than a second distance between the first under bump metallurgy structure and the second under bump metallurgy structure;
a first conductive via between the first conductive pad and the first under bump metallurgy structure, wherein the first conductive via tapers from the first conductive pad toward the first under bump metallurgy structure; and
a second conductive via between the second conductive pad and the second under bump metallurgy structure, wherein the second distance is less than a third distance between the first conductive via and the second conductive via.

18. The package structure as claimed in claim 17, further comprising:
a first bonding element partially covered by the first under bump metallurgy structure; and
a second bonding element partially covered by the second under bump metallurgy structure, wherein a third distance between the first bonding element and the second bonding element is less than the first distance.

19. The package structure as claimed in claim 17, further comprising:
a first bonding element partially covered by the first under bump metallurgy structure; and
a second bonding element partially covered by the second under bump metallurgy structure, wherein a third distance between the first bonding element and the second bonding element is less the second distance and greater than the first distance.

20. The package structure as claimed in claim 17, wherein a width of the first conductive via is less than a width of the first under bump metallurgy structure.

\* \* \* \* \*